US010305504B1

(12) United States Patent
Azenkot et al.

(10) Patent No.: US 10,305,504 B1
(45) Date of Patent: May 28, 2019

(54) HIGH FREQUENCY DIGITAL-TO-ANALOG CONVERSION BY INTERLEAVING WITHOUT RETURN-TO-ZERO

(71) Applicant: MACOM Technology Solutions Holding, Inc., Lowell, MA (US)

(72) Inventors: Yehuda Azenkot, San Jose, CA (US); Nanda Govind Jayaraman, Santa Clara, CA (US)

(73) Assignee: MACOM Technology Solutions Holding, Inc., Lowell, MA (US)

( * ) Notice: Subject to any disclaimer, the term of this patent is extended or adjusted under 35 U.S.C. 154(b) by 0 days.

(21) Appl. No.: 15/955,516

(22) Filed: Apr. 17, 2018

(51) Int. Cl.
*H03D 7/16* (2006.01)
*H03M 1/66* (2006.01)
*H03M 1/74* (2006.01)
*H03M 1/82* (2006.01)
*H03K 5/135* (2006.01)

(52) U.S. Cl.
CPC ............ *H03M 1/662* (2013.01); *H03D 7/165* (2013.01); *H03K 5/135* (2013.01); *H03M 1/742* (2013.01); *H03M 1/822* (2013.01)

(58) Field of Classification Search
CPC ...... H03M 1/662; H03M 1/822; H03M 1/742; H03K 5/135; H03D 7/165

USPC .................................................. 341/141, 144
See application file for complete search history.

(56) References Cited

U.S. PATENT DOCUMENTS

| | | | |
|---|---|---|---|
| 8,823,568 B2 * | 9/2014 | Cowley ................. | H03M 1/662 341/144 |
| 9,954,547 B1 * | 4/2018 | Azenkot ............... | H03M 1/128 |
| 9,973,203 B1 * | 5/2018 | Azenkot ................ | H03M 1/74 |

\* cited by examiner

*Primary Examiner* — Khai M Nguyen

(57) ABSTRACT

An interleaved DAC utilizes a set of positive sub-DACs and a set of negative sub-DACs for converting digital inputs in parallel without return to zero. For each digital input, a positive sub-DAC performs conversion and drives its analog output for a duration of $N/f_s$; and a negative sub-DAC performs conversion and drives its analog output for a duration of $(N-1)/f_s$, and by a delay of $1/f_s$. The positive sub-DAC and the negative sub-DAC start the conversion at the same time. By combining the outputs from the two sets of sub-DACs, the output from the positive sub-DAC is effectively removed when it is no longer needed at the combined output. As a result, the combined analog signal has each data point valid only for a duration of T, thereby achieving the desired data conversion speed of $f_s$.

22 Claims, 6 Drawing Sheets

|        |    |    |    |    |    |    |    |    |    |     |     |
|--------|----|----|----|----|----|----|----|----|----|-----|-----|
| DAC 1  | x1 | x1 | x1 | x1 | x1 | x6 | x6 | x6 | x6 | x6  | x11 |
| DAC 2  |    | x2 | x2 | x2 | x2 | x2 | x7 | x7 | x7 | x7  | x7  |
| DAC 3  |    |    | x3 | x3 | x3 | x3 | x3 | x8 | x8 | x8  | x8  |
| DAC 4  |    |    |    | x4 | x4 | x4 | x4 | x4 | x9 | x9  | x9  |
| DAC 5  |    |    |    |    | x5 | x5 | x5 | x5 | x5 | x10 | x10 |
| DAC 6  | -x1| -x1| -x1| -x1| -x5| -x5| -x5| -x5| -x9| -x9 | -x9 |
| DAC 7  |    | -x2| -x2| -x2| -x2| -x6| -x6| -x6| -x6| -x10| -x10|
| DAC 8  |    |    | -x3| -x3| -x3| -x7| -x7| -x7| -x7| -x7 | -x11|
| DAC 9  |    |    |    | -x4| -x4| -x4| -x8| -x8| -x8| -x8 | -x8 |
| Sum of 9 DACs |  |  |  |  | x1 | x2 | x3 | x4 | x5 | x6 | x7 |

*FIG. 5*

HIGH FREQUENCY DIGITAL-TO-ANALOG CONVERSION BY INTERLEAVING WITHOUT RETURN-TO-ZERO

CROSS REFERENCE TO RELATED PATENT APPLICATION

This application is related to: the co-pending commonly-assigned U.S. patent application Ser. No. 15/616,490, filed on Jun. 7, 2017, entitled "HIGH FREQUENCY DIGITAL-TO-ANALOG CONVERSION BY INTERLEAVING WITHOUT RETURN-TO-ZERO" and related to the co-pending commonly-assigned U.S. patent application Ser. No. 15/668,470, filed on Aug. 3, 2017, entitled "HIGH FREQUENCY DIGITAL-TO-ANALOG CONVERSION BY INTERLEAVING WITHOUT RETURN-TO-ZERO." The entire contents of the foregoing patent applications are herein incorporated by reference for all purposes.

TECHNICAL FIELD

Embodiments of the present disclosure relates generally to the field of signal processing in communications and, more specifically, to the field of digital-to-analog conversion in signal processing.

BACKGROUND OF THE INVENTION

Digital-to-Analog Converters (DACs) are commonly employed in state-of-the art network communication paths to convert base-band and intermediate-frequency (IF) data from the digital to analog domains. With the ever-increasing data transmission rates and bandwidths in network communication technologies, high-speed, high-precision DACs have become more and more important for achieving desired performances of a wide range of components in a network system. However, it has been challenging to develop DACs that can satisfy the requirements of high frequency systems, such as the 112 GHz systems.

FIG. 1 illustrates an example of a conventional DAC 100 in accordance with the prior art. A single DAC 100 is configured to operate in the full desired Digital-to-Analog (D/A) conversion rate and covert the digital input 101 (e.g., 8 bits digital data) to an analog output 103. As shown in diagram 110, the clock signal 102 to the DAC 100 has the same frequency as the desired data conversion rate ($f_s$). For each digital input 101, a full clock cycle T (=$1/f_s$) is needed for the DAC 100 to accomplish D/A conversion. However, it is difficult to implement such a DAC to high speeds (e.g., 112 GHz) due to the fundamental limitations of the particular technology nodes, e.g., 28 nm, 16 nm, and 7 nm, etc.

One way to scale up DAC speed is to interleave lower speed sub-DACs to add up to a high speed data output. FIG. 2 illustrates an example of a conventional interleaved DAC 200 in accordance with the prior art. In this example, for obtaining an overall data conversion rate $f_s$ of 112 GHz, the interleaved DAC 200 includes 4 parallel sub-DACs 211-214, each sub-DAC having a clock (CLK) frequency of 28 GHz (=$f_s/4$). As shown in diagram 220, the clock signal of a respective sub-DAC is shifted by a clock phase of 90° from that of the preceding sub-DAC. The analog outputs 221-224 of the sub-DACs 211 are combined to produce a resultant analog output 231, e.g., simply connected together.

To provide the analog outputs from the 4 sub-DACs 211-214 separately and successively in the resultant analog output 231, the clock for each sub-DAC does not have the ON pulse overlap with the ON pulse of the remaining sub-DACs' clocks. Thus, at any given point in time, only one sub-DAC drives the output at 231. As shown in the clock time diagrams 220, the pulse width of each clock (CLK1-CLK4) extends only for a T=1/112 GHz, and the analog output of the sub-DAC drops to zero at the end of T, the so-called "return-to-zero" technique. Unfortunately, the difficulties in accomplishing a conversion by a sub-DAC in such a narrow pulse width do not ease up the implementation of individual sub-DACs even if 10 or 100 more interleaved sub-DACs are used.

SUMMARY OF THE INVENTION

Accordingly, disclosed herein is directed to a time-interleaved digital-to-analog converter (DAC) that offers high conversion speeds yet with reduced speed requirement for sub-DACs.

Embodiments of the present disclosure provide an interleaved DAC including N positive sub-DACs and N−1 negative sub-DACs, where N is an integer greater than 1. Each positive sub-DAC is driven by a clock frequency of and each negative sub-DAC is driven by a clock frequency of $f_s/(N-1)$. Each digital input is provided to both a positive sub-DAC and a negative sub-DAC for conversion at the same time, where the clock signal of the negative sub-DAC and the clock signal of the positive sub-DAC have their rising edges aligned. Responsive to a same digital input, the positive sub-DAC produces a positive analog output, and the negative sub-DAC produces a negative analog output of the same magnitude. Further, the clock signals for two positive sub-DACs configured to convert two consecutive digital inputs are offset by the phase of $T=1/f_s$; and the clock signals for two negative sub-DACs configured to convert two consecutive digital inputs are offset by the same phase of $T=1/f_s$.

Responsive to a digital input, each positive sub-DAC operates to perform the conversion and drive its analog output for a duration of $N \times T = N/f_s$; and each negative sub-DAC operates to drive its analog output responsive to a digital input for a duration of $(N-1) \times T = (N-1)/f_s$. Thus, the positive sub-DAC drives a data point for a duration $N \times T$, during which time the negative sub-DAC removes this data unit for a duration of $(N-1) \times T$. As such, by combining the analog outputs of both sets of sub-DACs, a particular output from a positive sub-DAC is removed by subtraction from the combined analog output when it is no longer needed at the output. Since the positive and negative conversion for a digital input start at the same time, the corresponding analog output appears in the combined analog output with a delay of $(N-1) \times T$ from the conversion starting time. As a result, the combined analog output has each data point valid only for a duration of T and then the next data point emerges, thereby achieving the desired data conversion speed of $f_s=1/T$.

Embodiments of the present disclosure utilize an interleaving DAC architecture that can advantageously overcome the fundamental limitations in scaling the traditional return-to-zero interleaving architecture. According to the present disclosure, two or more sub-DACs can be simultaneously driving output responsive to respective digital inputs. This can advantageously remove the restriction on the ON time of the clock's pulse width to be equal to $1/f_s=1/$(Full-rate), and the ON times of several sub-DACs can overlap with each other.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

DETAILED DESCRIPTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. Although a method may be depicted as a sequence of numbered steps for clarity, the numbering does not necessarily dictate the order of the steps. It should be understood that some of the steps may be skipped, performed in parallel, or performed without the requirement of maintaining a strict order of sequence. The drawings showing embodiments of the invention are semi-diagrammatic and not to scale and, particularly, some of the dimensions are for the clarity of presentation and are shown exaggerated in the Figures. Similarly, although the views in the drawings for the ease of description generally show similar orientations, this depiction in the Figures is arbitrary for the most part. Generally, the invention can be operated in any orientation.

BRIEF DESCRIPTION OF THE DRAWINGS

Embodiments of the present invention will be better understood from a reading of the following detailed description, taken in conjunction with the accompanying figures, in which like reference characters designate like elements.

FIG. 5 is a table showing the digital input schedule at the individual sub-DACs and the resultant analog signal at the combined analog output of the DAC as shown in FIG. 3.

Although embodiments of the present disclosure are described by using a full rate of $f_s = 112$ GHz, the present disclosure is not limited to any particular frequency or frequency range, nor limited to any specific number of sub-DACs in an interleaved DAC. An interleaved DAC in accordance with the present disclosure can be implemented by using hardware logic, software logic or a combination thereof. While embodiments described in detail herein have 5 positive and 4 negative sub-DACs, the present disclosure can be extended for use with architectures using 4 positive and 3 negative, or 6 positive and 5 negative, or 7 positive and 6 negative sub-DACs, etc.

Figure 1:
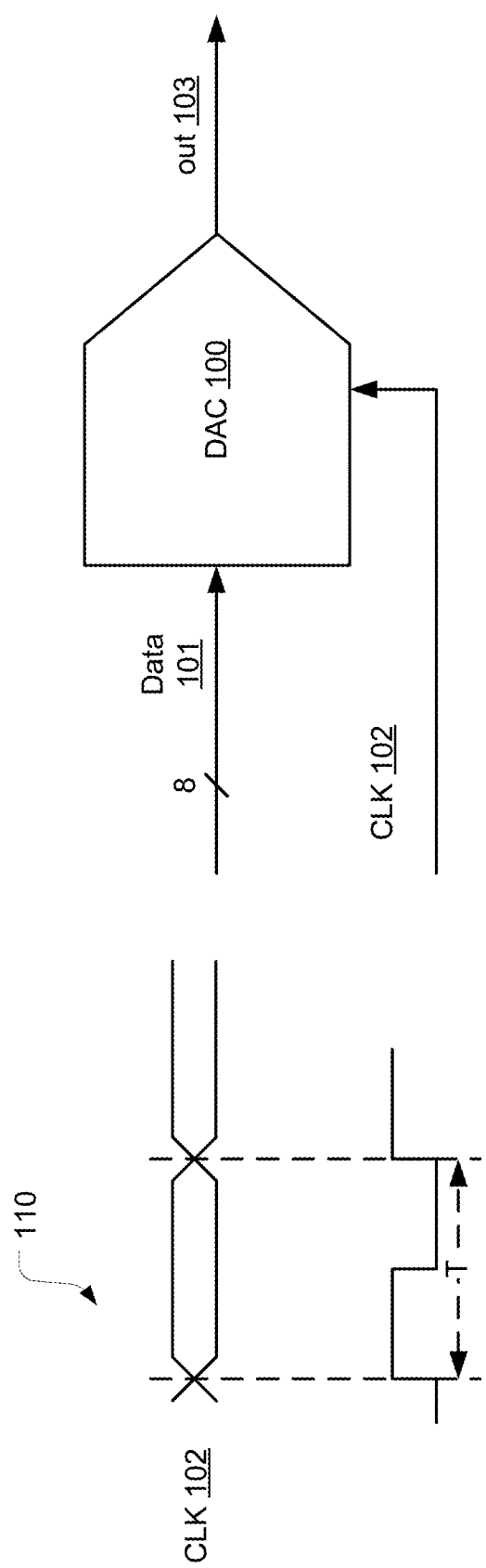
FIG. 1 illustrates an example of a conventional DAC in accordance with the prior art.
Figure 2:
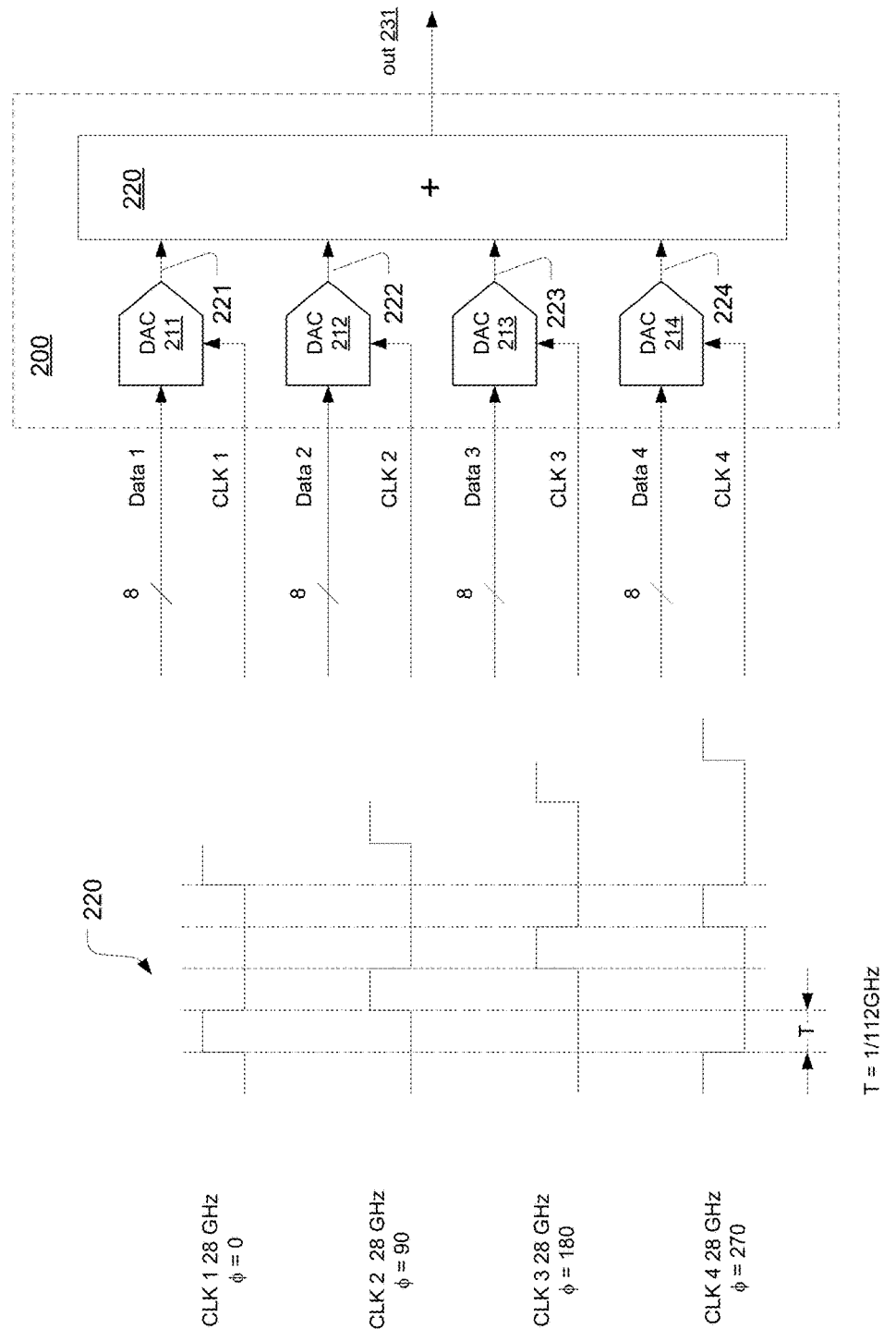
FIG. 2 illustrates an example of a conventional interleaved DAC in accordance with the prior art.
Figure 3:
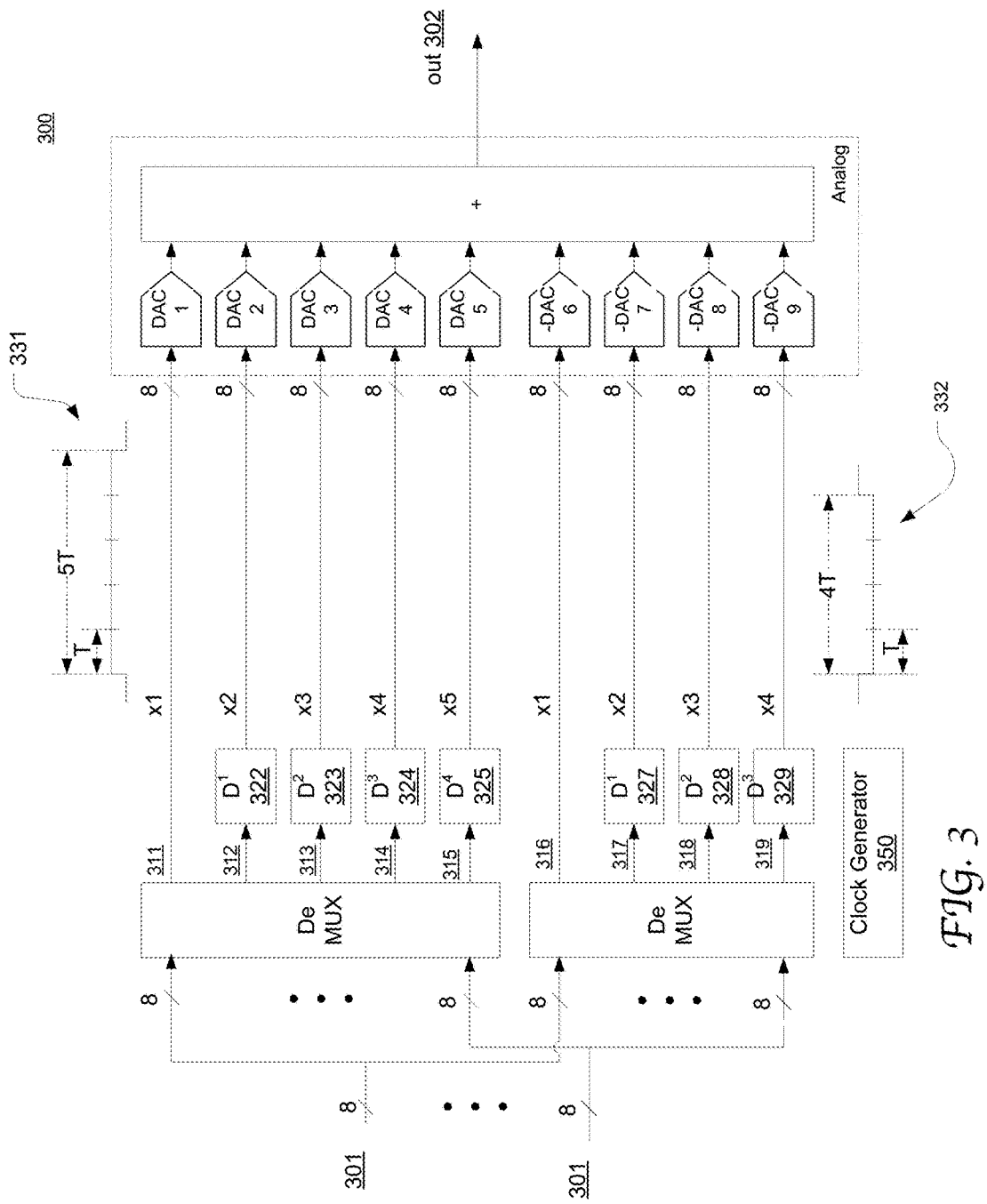
FIG. 3 illustrates the configuration of an exemplary interleaved DAC including a set of positive sub-DACs and a set of negative sub-DACs in accordance with an embodiment of the present disclosure.
Figure 4:
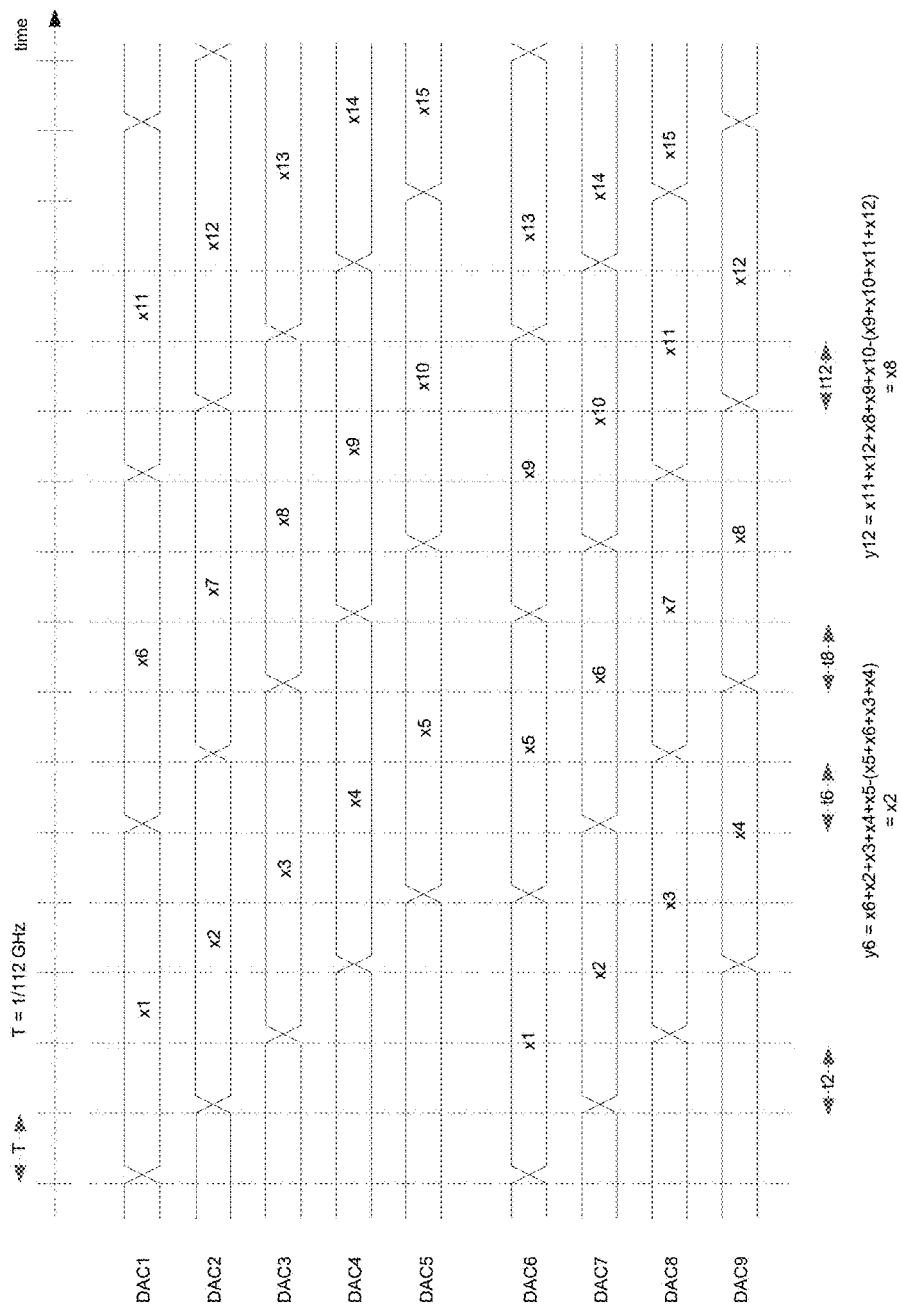
FIG. 4 illustrates the timing diagrams of the input digital inputs x1-x15 supplied to respective sub-DACs of the DAC as shown in FIG. 3.

FIG. 3 illustrates the configuration of an exemplary interleaved DAC 300 including a set of positive sub-DACs and a set of negative sub-DACs in accordance with an embodiment of the present disclosure. FIG. 4 illustrates the timing diagrams of the input digital inputs x1-x15 supplied to respective sub-DACs of the DAC 300 as shown in FIG. 3.

In this example, as shown in FIG. 3, N equals 5 and accordingly there are 5 positive sub-DACs and 4 negative sub-DACs. Each set of sub-DACs is coupled to a demultiplexer which demultiplexes a digital signal to provide digital data points 311-319. Delay units 322-329 act to add respective delays to the digital data points such that they are supplied to the corresponding sub-DACs according to a particular time schedule as shown in FIG. 4 and described in greater detail below.

The clock generator 350 supplies respective clock signals for the sub-DACs in two different frequencies. Particularly, the positive sub-DACs, DAC1 to DAC5, are driven by the clock signals with a frequency of $f_s/5$, where $f_s = 112$ GHz, e.g., as shown by the exemplary clock signal 331 and FIG. 4. The negative sub-DACs, DAC6 to DAC9, are driven by the clock signals with a frequency of $f_s/4$, as shown by the exemplary clock signal 332 and FIG. 4.

The clock signals to the sub-DACs are offset in phase relative to each other. Particularly, the clock to DAC2 is delayed by $T=1/f_s$ relative to the clock to DAC1, the clock to DAC3 is delayed by T relative to the clock to DAC2, and so on. The clock signals to DAC6 starts at the same phase as the clock to DAC1, the clock to DAC7 is delayed by T relative to the clock to DAC6. The clock to DAC8 is delayed by T relative to the clock to DAC7. The clock to DAC9 is delayed by T relative to the clock to DAC8. The clock to DAC6 is delayed by T relative to the clock to DAC9, and so on. In this configuration, the 7 delay units are used for the 9 DACs.

Correspondingly, the digital inputs (e.g., x1-x5 as shown) are supplied respectively to the positive DACs DAC1-DAC5 successively with a delay T in between each two; and the digital inputs are supplied respectively to the negative DACs DAC6-DAC9 successively with a delay T in between each two. However, each data point is supplied to a positive DAC and a negative DAC at the same time. Thus, for converting the data point (e.g., x1), the positive DAC and the negative DAC (e.g., DAC1 and DAC6) start the conversion at the same time without delay from each other.

In responsive to a digital input, a positive sub-DAC operating at a clock frequency of $f_s/5$ drives the conversion, and its analog outputs holds at the combined output 302, for 5 T; while a negative sub-DAC operating at a clock frequency of $f_s/4$ drives the conversion, and its analog outputs holds at the combined output 302, for 4 T.

In this embodiment, the outputs of all 9 sub-DACs are connected together, so the output currents are summed into the combined analog signal. Particularly, as shown in FIG. 4, the outputs of DAC1 to DAC5 are summed, and the outputs of DAC6 to DAC9 are subtracted from the sum of DAC1 to DAC5. In some embodiments, the subtraction can be achieved by connecting the negative lines of the differential outputs of DAC6 to DAC9 to the positive lines of DAC1 to DAC5.

As shown in FIG. 4, the positive sub-DACs, DAC1 to DAC5, get clocks at the frequency of $f_s/5$, where $f_s=112$ GHz. The 5 clocks (not explicitly shown) are shifted by a phase of T=1/112 GHz relative to each other, so the clock to DAC2 is delayed by T relative to the clock to DAC1, and the clock to DAC3 is delayed by T relative to the clock to DAC2, and so on. The negative sub-DACs, DAC6 to DAC9, get clocks at the frequency of $f_s/4$, where $f_s=112$ GHz. The 4 clocks (not explicitly shown) are shifted by a phase of T=1/112 GHz relative to each other, so the clock to DAC7 is delayed by T relative to the clock to DAC6, and the clock to DAC8 is delayed by T relative to the clock to DAC7, and so on. Each pair of positive and negative DACs have their clock signals aligned at the starting edges for converting the same data point, e.g., the pair of DAC 1 and DAC 6 for converting x1, the pair of DAC 2 and DAC7 for converting x2, and so on.

FIG. 5 is a table showing the digital input schedule at the individual sub-DACs and the resultant analog signal at the combined analog output 302 of the DAC 300 as shown in FIG. 3. Each column in the table corresponds to one T. DAC1 gets the first digital 8-bit input x1 which extends for 5 T. Then DAC2 gets the next input x2 after a delay of T for the duration of 5 T. DAC3 gets the next input x3 after a delay of T relative to DAC2 input for 5 T. DAC4 gets the next input x4 after a delay of T relative to DAC3 input for 5 T. DAC5 gets the next input x5 after a delay of T relative to DAC4 input for 5 T. Then, DAC1 gets the next input x6 after a delay of T relative to DAC5 input for 5 T, and so on. Referring back to FIG. 4, these delays are added by the delay units 322-329, respectively.

The inputs to DAC6 to DAC9 are scheduled as follows. DAC6 gets the first digital 8-bit input x1 which extends for 4 T. The input x1 to DAC6 is synchronized with x1 that is input to DAC1. Then DAC7 gets the next input x2 after a delay of T relative to the DAC6 input for 4 T. DAC8 gets the next input x3 after a delay of T relative to DAC7 input for 4 T. DAC9 gets the next input x4 after a delay of T relative to DAC8 input for 4 T. Then, DAC6 gets the next input x5 after a delay of T relative to DAC9 input for 4 T. DAC7 gets the next input x6 after a delay of T relative to DAC6 input for 4 T, and so on.

The output analog signal at the combined output 302 in FIG. 3, which is obtained by the summation of the 9 DACs outputs (e.g., current outputs) as shown in FIG. 5, is equivalent to the digital 8-bit inputs x1, x2, etc. For example, referring back to FIG. 4, at time t6, the combined result at the DAC output 302 can be expressed as, $$y6=x6+x2+x3+x4+x5-(x5+x6+x3+x4)=x2;$$

and at time t12, the combined result at the DAC output 302 can be expressed as, $$y12=x11+x12+x8+x9+x10-(x9+x10+x11+x12)=x8.$$

Hence, x2 is output at the combined output 302 after 4 T since DAC2 and DAC 7 receive x2 and start the conversion; and x8 is output at the combined output 302 after 4 T since DAC3 and DAC 9 receive x8 and start the conversion at t8.

According to embodiments of the present disclosure, since the ON times of several sub-DACs can overlap with each other, 2 or more sub-DACs can be concurrently driving the analog output of the interleaved DAC. Hence the interleaved DAC can advantageously remove the restriction on the ON time of the clock's pulse width to be equal to $T=1/f_s=1/(\text{Full-rate})$ which is difficult to implement in practice. Thus, the interleaved DAC mechanism can advantageously remove the fundamental limitations in scaling the traditional return-to-Zero interleaving architecture.

It will be appreciated that the sub-DACs in an interleaved DAC according to the present disclosure can be implemented in any suitable manner that is well known in the art without departing from the scope of the present disclosure. The sub-DACs may be pulse-width modulator-based, oversampling DACs, binary-weighted DAC, etc. An interleaved DAC may include various other components that are well known in the art. An interleaved DAC according to the present disclosure may be used in various suitable applications, e.g., a waveform generator in a network system, data acquisition, test and measurement applications, etc.

Figure 6:
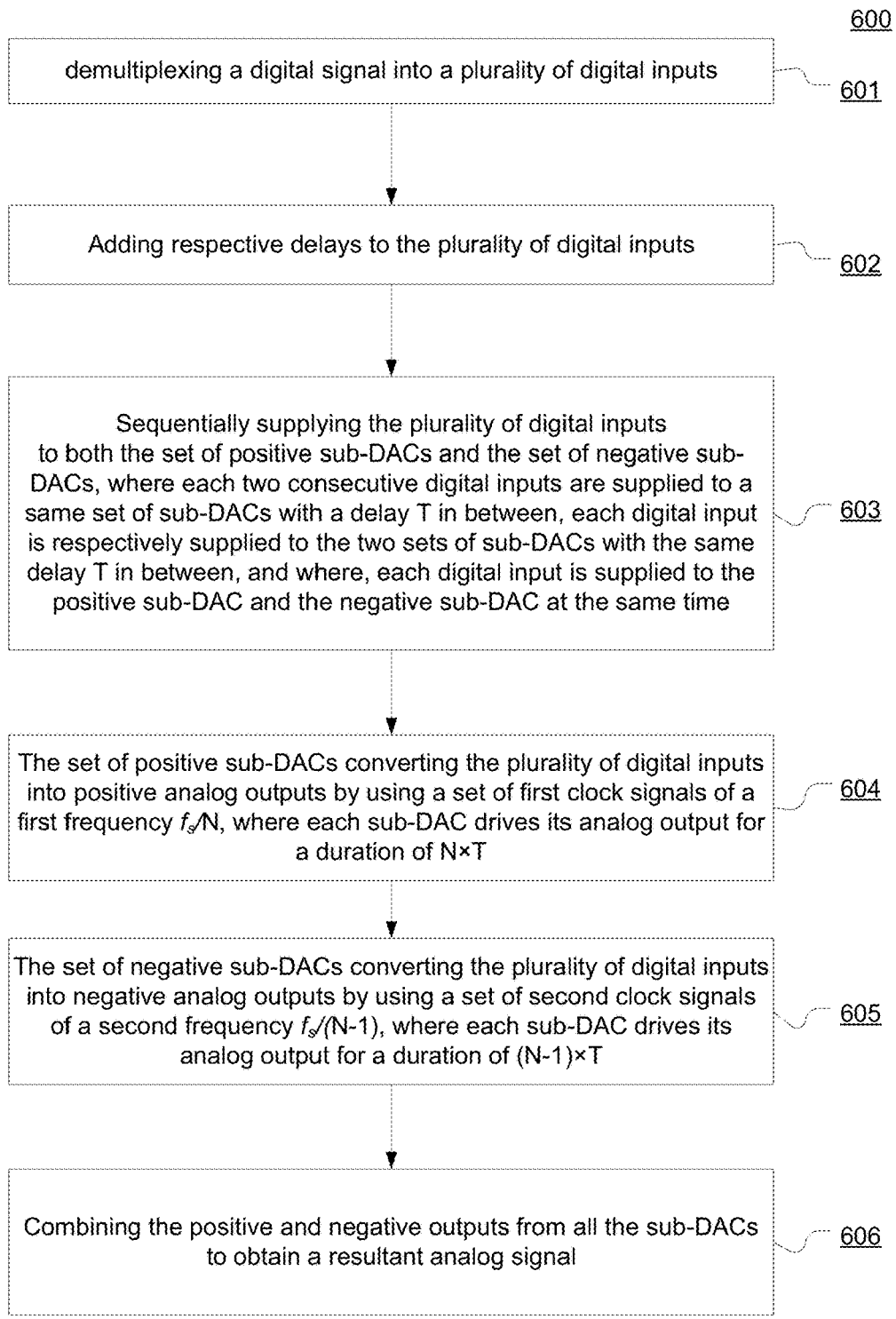
FIG. 6 is a flow chart depicting an exemplary process of converting a digital signal to an analog signal by time-interleaving sub-DACs and without return to zero in accordance with an embodiment of the present disclosure Overall, embodiments of the present disclosure provide an interleaved DAC that can offer high conversion speeds with reduced speed requirement for sub-DACs. The interleaved DAC utilizes a set of positive sub-DACs and a set of negative sub-DACs for converting a plurality of digital inputs in parallel. For a digital input, each positive sub-DAC can perform conversion and drive its analog output for a duration of $N \times T = N/f_s$; and each negative sub-DAC operates to drive its analog output for a duration of $(N-1) \times T = (N-1)/f_s$. The positive sub-DAC and the negative sub-DAC start the conversion of the digital input at the same time as their clock signals have the rising edges aligned. The analog outputs of the two sets of sub-DACs are combined so that the output from the positive sub-DAC is removed when it is no longer needed at the output. In effect, the positive sub-DAC drives a data point for a duration $N \times T$ at the combined output, during which time the negative sub-DAC removes this data unit for a duration of $(N-1) \times T$. As a result, the combined analog signal has each data point valid only for a duration of T and then the next data point emerges, thereby achieving the desired data conversion speed of $f_s = 1/T$. From the time that a positive-DAC and a negative sub-DAC start the conversion of a data unit, the analog output of the data point shows up in the combined analog signal in delay by $(N-1) \times T$.

FIG. 6 is a flow chart depicting an exemplary process 600 of converting a digital signal to an analog signal by time-interleaving sub-DACs and without return to zero in accordance with an embodiment of the present disclosure. Process 600 may be performed by an interleaved DAC as shown in FIG. 3. However, the present disclosure is not limited to such configuration.

At 601, a digital signal is demultiplexed into a plurality of digital inputs. At 602, respective delays are added to the digital inputs by using the delay units. At 603, the plurality of digital inputs are successively supplied to the set of positive sub-DACs and the set of second sub-DACs according to an input schedule, as described in greater detail with reference to FIGS. 4 and 5. Particularly, each two consecutive digital inputs are supplied to the same set of sub-DACs with a delay T in between. For example, as shown in FIG. 4, the input x2 to DAC 2 is delayed by T relative to the input x1 to DAC1; and the input x3 to DAC3 is delayed by T relative to the input x2 to DAC2, where $T=1/f_s$, and $f_s$ is the effective data conversion rate of the interleaved DAC. For a particular digital input, it is supplied to the input of a negative sub-DAC and the input of a positive sub-DAC simultaneously without delay.

At 603, the set of positive sub-DACs convert the plurality of digital inputs into positive analog outputs by using a set of first clock signals having a first frequency $f_s/N$, where N equals to the number of positive sub-DACs in the set. Each positive sub-DAC can perform conversion and drive its analog output for a duration of $N \times T = N/f_s$. At 604, in parallel with 603, the set of negative sub-DACs convert the plurality of digital inputs into negative analog outputs by using a set of clock signals having a second frequency $f_s/(N-1)$. The number of negative sub-DACs in the set equals N−1. Each negative sub-DAC operates to drive its analog output for a duration of $(N-1) \times T = (N-1)/f_s$.

The clock signals to the sub-DACs are offset in phase relative to each other. Particularly, two clock signals used for converting every two consecutive digital inputs to corresponding positive analog outputs are shifted from each other by a phase of T. Two clock signals used for converting every two consecutive digital inputs to corresponding negative analog outputs are shifted from each other by a phase of T. For each digital input, the clock signals to its positive sub-DAC and its negative sub-DAC are have their rising edges synchronized; and the analog output from the positive sub-DAC is an opposite value of the analog output from the negative sub-DAC, i.e., with the same magnitude but an opposite sign.

At 606, the positive analog outputs and the negative analog outputs are combined into the resultant analog output. Each analog output from a positive DAC contributes to the resultant analog output for 5 T, and each analog output from a negative DAC contributes to the resultant analog output for 4 T. By using the particular input schedule and the clock signal schedule as described above, the resultant analog output effectually includes a sequence of analog outputs from the positive sub-DACs in response to a sequence of digital outputs. Each data point appears in the resultant analog output after 4 T since it is supplied to the positive and the negative DACs for conversion.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method of digital-to-analog signal conversion, said method comprising:
   converting a plurality of digital inputs to first analog outputs in parallel by respectively using a set of first clock signals of a first frequency;
   in parallel with said converting to said first analog outputs, converting said plurality of digital inputs to second analog outputs in parallel by respectively using a set of second clock signals of a second frequency that is different from said first frequency,
   wherein said convertings comprise:
      converting a respective digital input of said plurality of digital inputs into a first analog output by using a first clock signal of said set of first clock signals;
      converting said respective digital input into a second analog output by using a second clock signal of said set of second clock signals, and wherein further said first clock signal and said second clock signal are synchronized at an edge for converting said respective digital input to said first analog output and said second analog output respectively; and
   combining said second analog outputs with said first analog outputs to sequentially output said first analog outputs as a resultant analog signal.

2. The method of claim 1, wherein first clock signals used for converting every two consecutive digital inputs of said plurality of digital inputs to corresponding first analog outputs are shifted from each other by a first phase, and wherein second clock signals used for converting every two consecutive digital inputs in said plurality of digital inputs to corresponding second analog outputs are shifted from each other by said first phase.

3. The method of claim 1, wherein said second analog output has a negative value of said first analog output, wherein a first clock signal used for converting a digital input of said plurality of digital inputs to a first analog output is delayed from another first clock signal used for converting a preceding digital input of said plurality of digital inputs to a preceding first analog output by a first phase, and wherein a second clock signal used for converting a digital input of said plurality of digital inputs to a second analog output is delayed from another second clock signal used for converting a preceding digital input of said plurality of digital inputs to a preceding second analog output by said first phase.

4. The method of claim 2, wherein a ratio of said first frequency to said second frequency is (N−1)/N, wherein N is an integer greater than 1.

5. The method of claim 3, wherein said combining comprises adding said second analog outputs with said first analog outputs, and wherein further a delay between a time that said first analog output is output in said resultant analog signal and a time that said respective digital signal is converted to said first analog signal equals said first phase multiplied by (N−1).

6. The method of claim 2, wherein said first frequency equals $f_s/N$, wherein said second frequency equals $f_s/(N-1)$, wherein $f_s$ equals an effectively frequency of sequentially converting said plurality of digital inputs to said resultant analog signal, wherein said first phase equals $1/f_s$, and wherein further N is an integer greater than 1.

7. The method of claim 6, wherein each of said first analog outputs holds for a duration of $N/f_s$, and wherein further each of said second analog outputs holds for a duration of $(N-1)/f_s$.

8. The method of claim 6, wherein said converting said plurality of digital inputs to said first analog outputs comprises converting N digital inputs in parallel; and wherein said converting said plurality of digital inputs to said second analog outputs comprises converting N−1 digital inputs in parallel.

9. The method of claim 1 further comprising:
   demultiplexing a digital signal into another plurality of digital inputs; and
   adding respective delays to said another plurality of digital inputs to generate said plurality of digital inputs.

10. A Digital-to-Analog Converter (DAC) comprising:
   a set of first sub-DACs operable to be coupled to a set of first clock signals of a first frequency and configured to convert a plurality of digital inputs to first analog outputs, wherein first clock signals used for converting every two consecutive digital inputs of said plurality of digital inputs to corresponding first analog outputs are shifted from each other by a first phase;
   a set of second sub-DACs operable to be coupled to a set of second clock signals of a second frequency and configured to convert said plurality of digital inputs to second analog outputs in parallel with said plurality of digital outputs being converted to said first analog outputs, wherein said second frequency is different from said first frequency, and wherein further second clock signals used for converting every two consecutive digital inputs of said plurality of digital inputs to corresponding second analog outputs are shifted from each other by said first phase,
wherein a first sub-DAC of said set of first sub-DACs is configured to convert a respective digital input of said plurality of digital inputs into a first analog output by using a first clock signal of said set of first clock signals, and a second sub-DAC of said set of second sub-DACs is configured to convert said respective digital input into a second analog output by using a second clock signal of said set of second clock signals, and wherein further said first clock signal and said second clock signal are synchronized at an edge for converting said respective digital input to said first analog output and said second analog output respectively; and
a combined output configured to: combine said first analog outputs and said second analog outputs; and output a resultant analog signal.

11. The DAC of claim 10, wherein said second analog output has a negative value of said first analog output.

12. The DAC of claim 10, wherein a ratio of said first frequency to said second frequency is (N−1)/N, and wherein N is an integer greater than 1.

13. The DAC of claim 10, wherein said first frequency equals $f_s/N$, wherein said second frequency equals $f_s/(N-1)$, wherein $f_s$ equals an effectively frequency of said DAC sequentially converting said plurality of digital inputs to said resultant analog signal, wherein said first phase equals $1/f_s$, and wherein further N is an integer greater than 1.

14. The DAC of claim 13, wherein each of said first analog outputs holds for a duration of $N/f_s$, at said combined output, and wherein further each of said second analog outputs holds for a duration of $(N-1)/f_s$ at said combined output, and wherein further said combined output is configured to output said first analog output in said resultant analog signal at a time that is delayed by said first phase multiplied by (N−1) from a time that said first DAC converting said respective digital signal to said first analog signal.

15. The DAC of claim 12, wherein said set of first sub-DACs comprises N sub-DACs, and wherein further said set of second sub-DACs comprises N−1 sub-DACs.

16. The DAC of claim 10 further comprising:
a demultiplexer configured to demultiplex a digital signal into another plurality of digital inputs; and
delay units configured to add respective delays to said another plurality of digital inputs to generate said plurality of digital inputs for supply to said first sub-DACs and said second sub-DACs.

17. A communication system comprising:
an interface configured to receive a digital signal; and
an interleaved Digital-to-Analog Converter (DAC) coupled to said interface and configured to convert said digital signal into a resultant analog signal in an effectively frequency of $f_s$, wherein said interleaved DAC comprises:
a set of first sub-DACs operable to be coupled to a set of first clock signals of a first frequency equal to $f_s/N$, wherein said set of first sub-DACs are configured to convert a plurality of digital inputs to first analog outputs respectively, wherein N is an integer greater than 1;
a set of second sub-DACs operable to be coupled to a set of second clock signals of a second frequency equal to $f_s/(N-1)$, wherein said set of second sub-DACs are configured to convert said plurality of digital inputs to second analog outputs respectively and in parallel with said plurality of digital outputs being converted to said first analog outputs by said set of first sub-DACs,
wherein a first sub-DAC of said set of first sub-DACs is configured to convert a respective digital input of said plurality of digital inputs into a first analog output by using a first clock signal of said set of first clock signals, and wherein a second sub-DAC of said set of second sub-DACs is configured to convert said respective digital input into a second analog output by using a second clock signal of said set of second clock signals, wherein further said first clock signal and said second clock signal are synchronized at an edge for converting said respective digital input to said first analog output and said second analog output respectively; and
a combined output configured to combine analog outputs of said set of first sub-DACs and said second set of second sub-DACs to generated said resultant analog signal.

18. The communication system of claim 17, wherein each of said set of first sub-DACs is configured to drive a conversion of a digital input to a first analog output for a duration of $N/f_s$, and wherein each of said set of second sub-DACs is configured to drive a conversion of a digital input to a second analog output for a duration of $(N-1)/f_s$.

19. The communication system of claim 17, wherein first clock signals used for converting every two consecutive digital inputs of said plurality of digital inputs to corresponding first analog outputs are offset from each other by a first phase, and wherein second clock signals used for converting every two consecutive digital inputs of said plurality of digital inputs to corresponding second analog outputs are offset from each other by said first phase, and wherein further said first phase equals $1/f_s$.

20. The communication system of claim 17, wherein said first analog output and said second analog output have a same magnitude and opposite signs, wherein said first analog output is present at said combined output for a duration of $N/f_s$, wherein said second analog output is present at said combined output for a duration of $(N-1)/f_s$ and in a delay of $1/f_s$ than said first analog output.

21. The communication system of claim 20, wherein said combined output is configured to output said first analog output in said resultant analog signal at a time that is delayed by $(N-1)/f_s$ from a time that said first DAC converting said respective digital signal to said first analog signal.

22. The communication system of claim 21, wherein the interleaved DAC further comprises:
a demultiplexer configured to demultiplex said digital signal into another plurality of digital inputs; and
delay units configured to add respective delays to said another plurality of digital inputs to generate said plurality of digital inputs for supply to said first sub-DACs and said second sub-DACs.

* * * * *